United States Patent
Hibbeler et al.

(10) Patent No.: US 7,454,721 B2
(45) Date of Patent: Nov. 18, 2008

(54) METHOD, APPARATUS AND COMPUTER PROGRAM PRODUCT FOR OPTIMIZING AN INTEGRATED CIRCUIT LAYOUT

(75) Inventors: Jason D. Hibbeler, Williston, VT (US); Rani Narayan, San Jose, CA (US); Robert F. Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 11/276,374

(22) Filed: Feb. 27, 2006

(65) Prior Publication Data

US 2007/0204249 A1    Aug. 30, 2007

(51) Int. Cl.
*G06F 17/50*    (2006.01)

(52) U.S. Cl. .................. 716/2; 716/5; 716/11

(58) Field of Classification Search ............ 716/2, 716/10, 5
See application file for complete search history.

(56) References Cited

U.S. PATENT DOCUMENTS

| | | | |
|---|---|---|---|
| 5,535,134 A | 7/1996 | Cohn et al. | |
| 5,842,192 A * | 11/1998 | Garcia et al. | 706/45 |
| 6,182,271 B1 | 1/2001 | Yahagi | |
| 6,189,132 B1 * | 2/2001 | Heng et al. | 716/11 |
| 6,704,921 B2 * | 3/2004 | Liu | 716/19 |
| 6,745,372 B2 * | 6/2004 | Cote et al. | 716/2 |
| 6,802,050 B2 * | 10/2004 | Shen et al. | 716/8 |
| 7,076,749 B2 * | 7/2006 | Kemerer et al. | 716/4 |
| 7,240,305 B2 * | 7/2007 | Lippincott | 716/4 |
| 7,257,783 B2 * | 8/2007 | Allen et al. | 716/3 |
| 2005/0188338 A1 * | 8/2005 | Kroyan et al. | 716/9 |
| 2006/0085773 A1 * | 4/2006 | Zhang | 716/4 |
| 2006/0095889 A1 * | 5/2006 | Cote et al. | 716/21 |

* cited by examiner

*Primary Examiner*—Paul Dinh
*Assistant Examiner*—Patrick Sandoval
(74) *Attorney, Agent, or Firm*—Ryan K. Simmons; Greenblum & Bernstein P.L.C.

(57) ABSTRACT

A method, apparatus, and computer program product for optimizing the layout of an integrated circuit design. Base ground rules and recommended ground rules are prioritized according to the impact they have on the yield of the integrated circuit design. The layout is optimized according to the prioritized base ground rules and recommended ground rules.

12 Claims, 4 Drawing Sheets

METHOD, APPARATUS AND COMPUTER PROGRAM PRODUCT FOR OPTIMIZING AN INTEGRATED CIRCUIT LAYOUT

BACKGROUND

1. Technical Field of the Present Invention

The present invention generally relates to the design of integrated circuits, and more specifically, to the optimization of the layout of the integrated circuit.

2. Description of Related Art

The design and manufacture of integrated circuits has a multitude of steps each of which is dependent upon the successful completion of the prior step. One such step is the layout of the integrated circuit. The layout is subject to complex rules (base ground rules) that govern such things as the geometry of shapes on various process layers. The base ground rules can include minimum and/or maximum values for width, spacing, overlap requirements, and the like.

In general, a design that complies with the base ground rules can be manufactured in a particular technology with a certain degree of certainty. The exception arises with the introduction of new process technologies (especially those that are in the sub-wavelength regimes) where the minimums/maximums specified for the base ground rules may not be as accurate, especially, in the beginning of the technology cycle. In order to deal with the inaccuracies, manufacturing facilities provide recommended ground rules that are usually larger than the minimum or smaller than the maximum.

As a given manufacturing technology matures, manufacturing engineers assign priorities to the recommended ground rules according to the effect compliance has on manufacturing yield. Prioritization of these rules is critical to a designer since it is nearly impossible to comply with all the recommended ground rules and still have an intended design function appropriately. Any modification of a layout to comply with the recommended ground rules should be done according to the assigned levels of priority. Obviously, compliance with any base ground rule minimum/maximums take priority over recommended ground rules.

Current layout optimization programs optimize a layout by setting the target value for the optimization equal to the recommended ground rule. This creates several problems. First, this type of optimization fails to take into account the prioritization of the rules and their corresponding trade-offs. Second, it fails to allow a recommended ground rule to be partially satisfied. For example, if M1 minimum spacing is 0.20 microns and the recommended value is 0.25 microns then any spacing greater than 0.20 microns is an improvement. Unfortunately, the current optimization programs would use the 0.25 microns as the target and cause the optimizer to attempt to move all M1 spacings to 0.25 microns at the expense of distributing available space according to those recommended ground rules that would benefit the yield the most.

It would, therefore, be a distinct advantage to have a method, apparatus, and computer program product that would weight the minimum base ground rules and recommended ground rules according to their benefits and applies the optimization of the integrated circuit design according to this prioritization.

SUMMARY OF THE PRESENT INVENTION

In one aspect, the present invention is a method of optimizing a layout of an integrated circuit design. The method includes the step of assigning a set of base ground rules each specifying a limit value for complying with the base ground rule. The method also includes the step of creating a set of recommended ground rule values each corresponding to one or more of the base ground rules. The method further includes the step of prioritizing the recommended ground rule values according to the impact they have on the yield of the layout for a specified manufacturing process. In addition, the method includes the step of optimizing the layout according to the prioritized recommended ground rule values.

BRIEF DESCRIPTION OF THE DRAWINGS

The present invention will be better understood and its advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

The present invention is a method, apparatus, and computer program product for optimizing the layout of an integrated circuit design. Minimum (or maximum) base ground rule values and recommended ground rule values are assigned a given weight/priority according to the benefits received from implementing the rule. The layout is optimized according to the weight of the priorities as explained in greater detail below. In a preferred embodiment of the present invention, the minimum and maximum values are assigned the highest priority.

Figure 1:
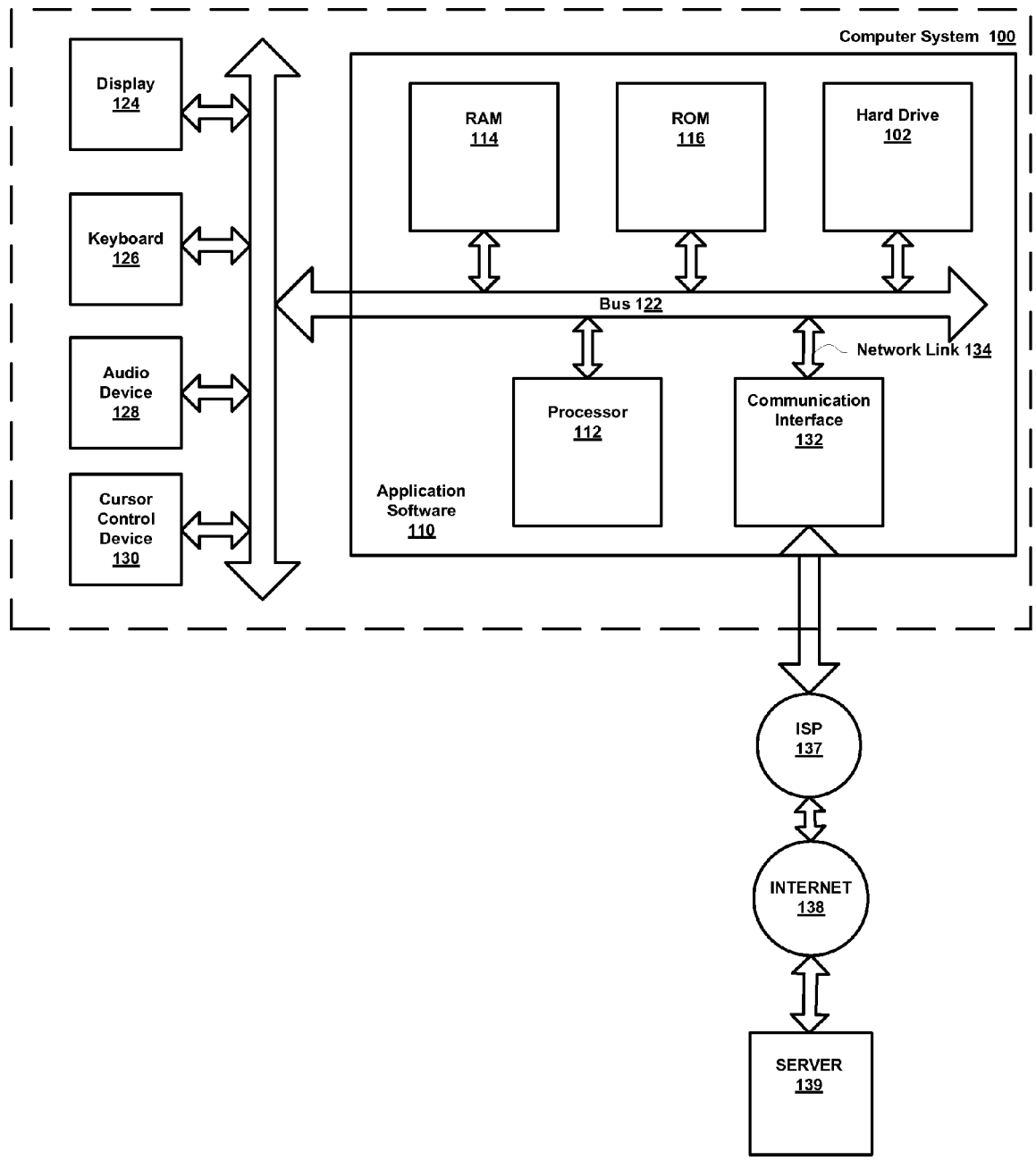
FIG. 1 is a block diagram illustrating a computer system that implements a preferred embodiment of the present invention.

Reference now being made to FIG. 1, a block diagram is shown illustrating a computer system 100 that implements a preferred embodiment of the present invention. Computer System 100 includes various components each of which are explained in greater detail below.

Bus 122 represents any type of device capable of providing communication of information within Computer System 100 (e.g., System bus, PCI bus, cross-bar switch, etc.)

Processor 112 can be a general-purpose processor (e.g., the PowerPC™ manufactured by IBM or the Pentium™ manufactured by Intel) that, during normal operation, processes data under the control of an operating system and application software 110 stored in a dynamic storage device such as Random Access Memory (RAM) 114 and a static storage device such as Read Only Memory (ROM) 116. The operating system preferably provides a graphical user interface (GUI) to the user.

The present invention, including the alternative preferred embodiments, can be provided as a computer program product, included on a machine-readable medium having stored on it machine executable instructions used to program computer system 100 to perform a process according to the teachings of the present invention.

The term "machine-readable medium" as used in the specification includes any medium that participates in providing instructions to processor 112 or other components of computer system 100 for execution. Such a medium can take many forms including, but not limited to, non-volatile media, and transmission media. Common forms of non-volatile media include, for example, a floppy disk, a flexible disk, a hard disk, magnetic tape, or any other magnetic medium, a Compact Disk ROM (CD-ROM), a Digital Video Disk-ROM (DVD-ROM) or any other optical medium whether static or rewriteable (e.g., CDRW and DVD RW), punch cards or any other physical medium with patterns of holes, a programmable ROM (PROM), an erasable PROM (EPROM), electrically EPROM (EEPROM), a flash memory, any other memory chip or cartridge, or any other medium from which computer system 100 can read and which is suitable for storing instructions. In the preferred embodiment, an example of a non-volatile medium is the Hard Drive 102.

Volatile media includes dynamic memory such as RAM 114. Transmission media includes coaxial cables, copper wire or fiber optics, including the wires that comprise the bus 122. Transmission media can also take the form of acoustic or light waves, such as those generated during radio wave or infrared data communications.

Moreover, the present invention can be downloaded as a computer program product where the program instructions can be transferred from a remote computer such as server 139 to requesting computer system 100 by way of data signals embodied in a carrier wave or other propagation medium via network link 134 (e.g., a modem or network connection) to a communications interface 132 coupled to bus 122.

Communications interface 132 provides a two-way data communications coupling to network link 134 that can be connected, for example, to a Local Area Network (LAN), Wide Area Network (WAN), or as shown, directly to an Internet Service Provider (ISP) 137. In particular, network link 134 may provide wired and/or wireless network communications to one or more networks.

ISP 137 in turn provides data communication services through the Internet 138 or other network. Internet 138 may refer to the worldwide collection of networks and gateways that use a particular protocol, such as Transmission Control Protocol (TCP) and Internet Protocol (IP), to communicate with one another. ISP 137 and Internet 138 both use electrical, electromagnetic, or optical signals that carry digital or analog data streams. The signals through the various networks and the signals on network link 134 and through communication interface 132, which carry the digital or analog data to and from computer system 100, are exemplary forms of carrier waves transporting the information.

In addition, multiple peripheral components can be added to computer system 100. For example, audio device 128 is attached to bus 122 for controlling audio output. A display 124 is also attached to bus 122 for providing visual, tactile or other graphical representation formats. Display 124 can include both non-transparent surfaces, such as monitors, and transparent surfaces, such as headset sunglasses or vehicle windshield displays.

A keyboard 126 and cursor control device 130, such as mouse, trackball, or cursor direction keys, are coupled to bus 122 as interfaces for user inputs to computer system 100.

The execution of application software 110 on computer system 100 according to a preferred embodiment of the present invention is explained in greater detail below.

Definitions

A layout refers to a collection of geometric objects (polygons, rectangles, etc.) within an assigned layer.

A layout element refers to one of the geometric objects. A layout element can be a single shape on a given layer, such as a wire; or can be a feature formed by the relationship between shapes on different layers, such as a transistor.

Figure 2:
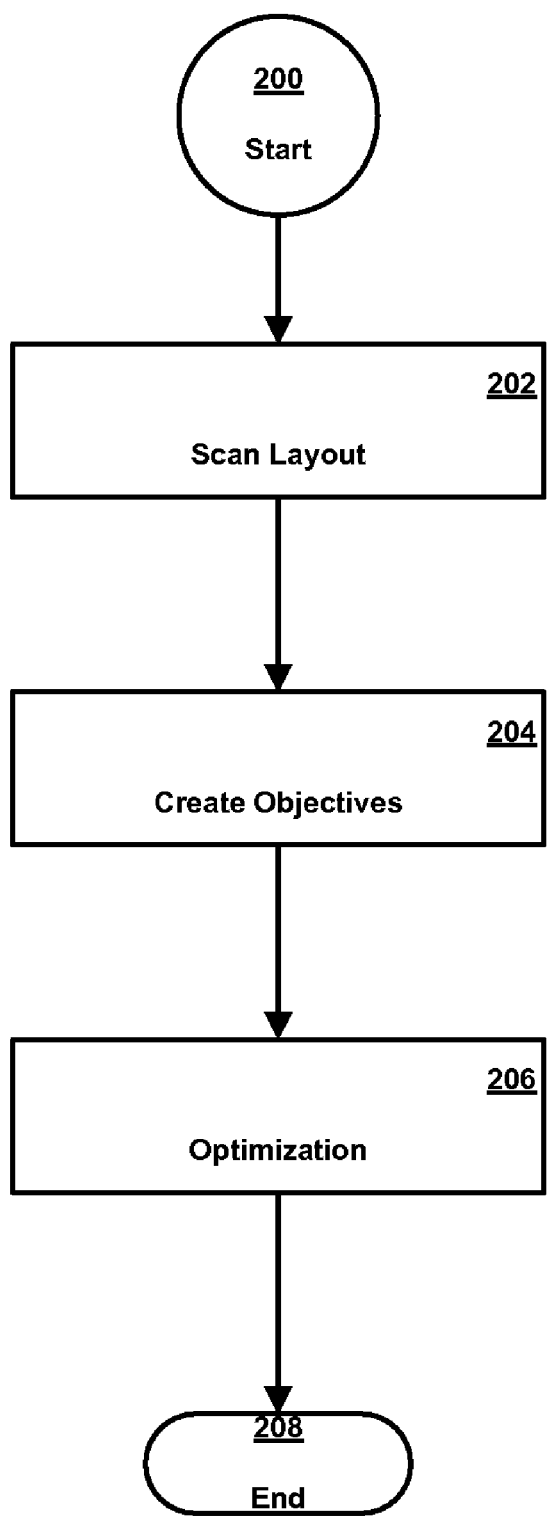
FIG. 2 is a flow chart illustrating a method for optimizing a layout design according to the teachings of the present invention.

Reference now being made to FIG. 2, a flow chart is shown illustrating a method for optimizing a layout design according to the teachings of the present invention. The optimization begins by scanning an existing layout for geometric relationships (e.g., spacing, width, overlap, and the like) that fail to comply with one of the ground rules (both minimum and recommended) (Steps 200-202). This scanning also finds geometric relationships representing ground rules that are satisfied. Any layout optimization should not cause these already-satisfied ground rules to be violated.

Figure 3:
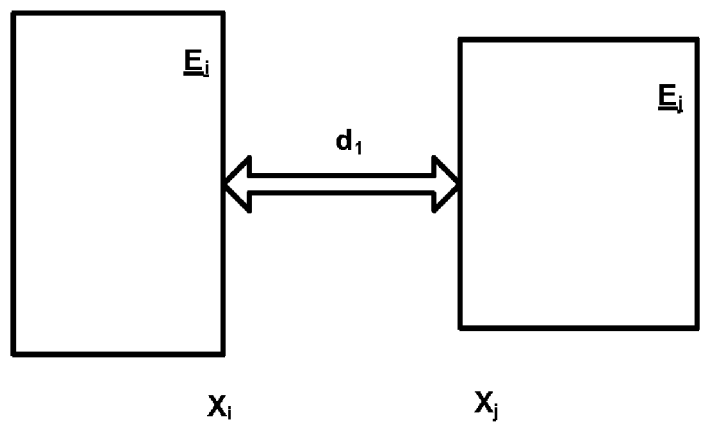
FIGS. 3 and 4 are layout diagrams illustrating two different examples of ground rules that layout elements $E_i$ and $E_j$ have failed.
Figure 4:
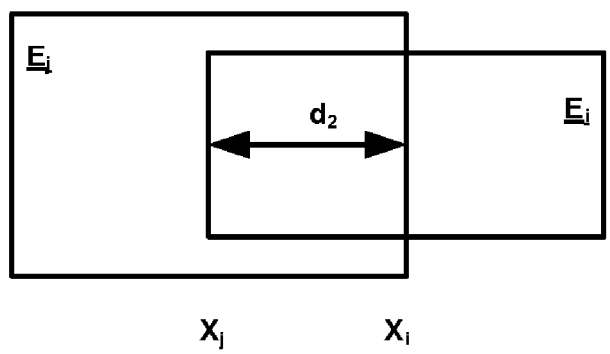

For example, FIGS. 3 and 4 are diagrams illustrating two different examples of base ground rules that layout elements $E_i$ and $E_j$ have failed. The position of layout elements $E_i$ and $E_j$ is represented by variables $X_i$ and $X_j$, respectively. In FIG. 3, a minimum separation required by a base ground rule between the two layout elements $E_i$ and $E_j$ can be represented by a linear constraint of the form $X_j - X_i \geq d_1$ where $d_1$ is the minimum required distance between the layout elements and should have a value of 6 units and is currently 4 units.

In FIG. 4, an overlap base ground rule constraint of $d_2$ units between Ei and Ej can be expressed by a linear constraint of the form $X_i - X_j \geq d_2$ where $d_2$ is the minimum required distance between the layout elements and should have a value of 5 units and is currently 3 units.

Referring again to FIG. 2, a piecewise linear objective function is created for each of these geometric relationships that fail to comply with a base ground rule or recommended ground rule and weighted according to there relative priority (Step 204).

In example, if the base ground rule specifies $X_j - X_i \geq d_1$ for distance between layout objects $E_j$ and $E_i$ then the objective function can be expressed as:

$F_{ij}(X_i, X_j) = W [d_1 - (X_j - X_i)]$ when $d_1 - (X_j - X_i) \geq 0$; and $F_{ij}(X_i, X_j) = 0$ otherwise, where W is the amount by which the objective function is weighted. In other words, W is the importance assigned to the failed constraint. The value of W is based upon factors such as whether the violation of the constraint resulted from attempting to fix a base ground rule or enforcing a recommended ground rule. The failure of a minimum/maximum base ground rule is given more weight than that of a recommended ground rule. Minimum/maximum base ground rules are given the highest priority (weighting) while recommended ground rules are allocated in a logarithmic fashion so that, if space is available, all recommended ground rules from a given priority group will be achieved prior to any recommended values from a lower group being obtained.

In other words, a sum of n priority W1 values will be less than one W0 value and a sum of n priority W2 values will be less than one W1 value. For example, with three priority classes W0, W1, and W2, W1 would equal W0/100 and W2 would equal W1/100. In this manner, a tight sequence of fewer than 100 objectives with weight W1 could not sum to be greater than a single objective with weight W0.

The layout is then optimized using a minimum-perturbation layout optimizer such as that disclosed by U.S. Pat. No. 6,189,132 to Heng et al. (Steps 206-208) according to the objective functions as weighted/prioritized.

Figure 5:
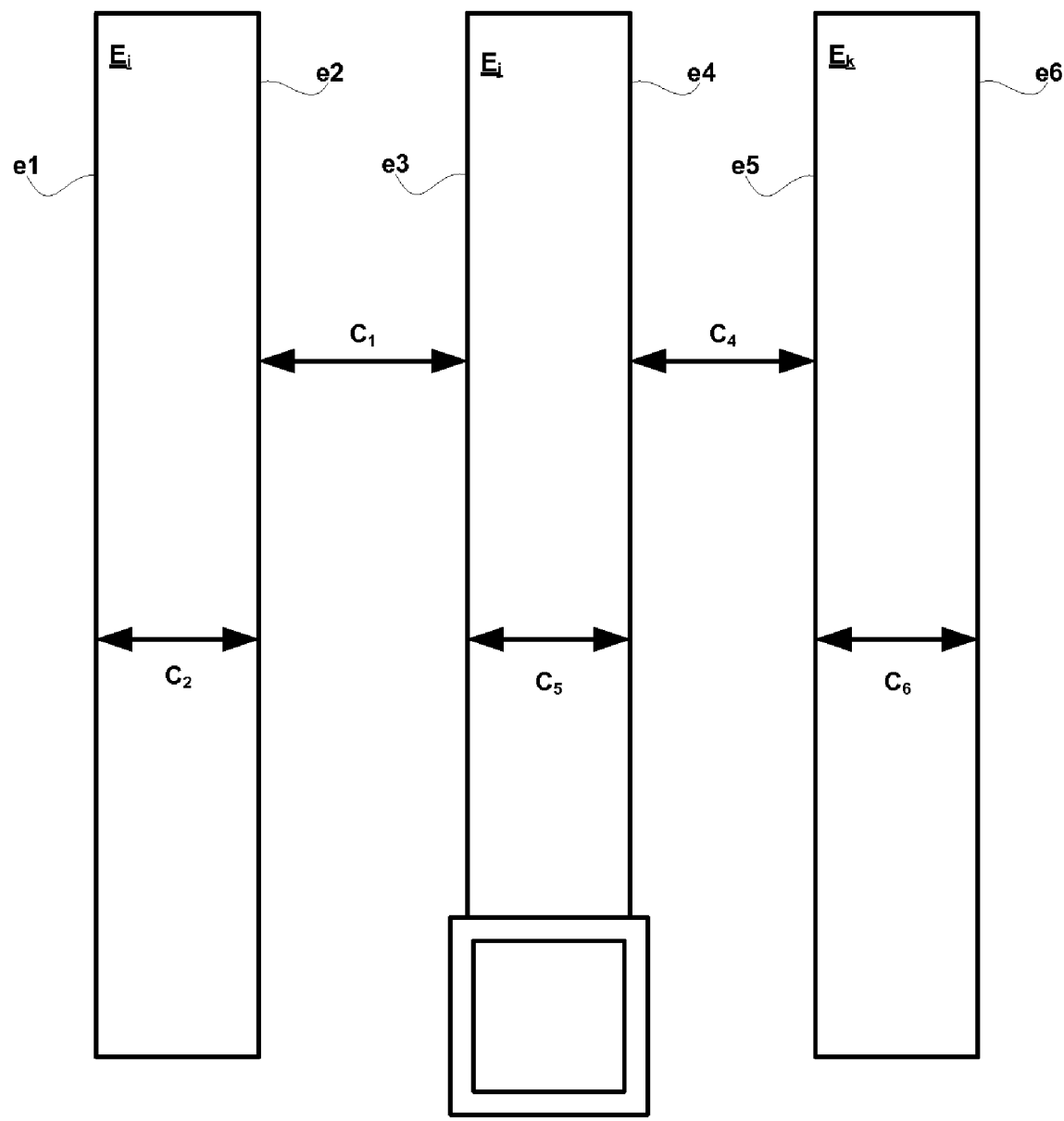
FIG. 5 is a layout diagram illustrating an example of layout elements $E_{i-k}$.

Reference now being made to FIG. 5, a layout diagram 500 is shown illustrating an example of layout elements $E_{i-k}$. The layout diagram 500 is optimized in the horizontal direction according to the present invention as explained below.

The layout diagram 500 is scanned for geometric relationships (e.g., spacing, width, overlap, and the like) that fail to comply with one of the ground rules (both minimum and recommended) (Steps 200-202). This scanning also finds geometric relationships representing ground rules that are satisfied. Any layout optimization should not cause these already-satisfied ground rules to be violated.

In this case, a minimum M1 spacing constraint base ground rule for edges e2 to e3 (represented by C1) and edges e4 to e5 (represented by C4) is violated. In addition, recommended ground rules for M1 width for layout elements $E_i$ to $E_k$ (as represented by C2 (edge e1 to e2), C5 (edge e3 to e4), and C6 (edge e5 to e6), respectively) are also violated.

In this instance, the recommended ground rule for spacing of layout objects on this layer is treated as more important than the recommended ground rule for width for objects on this layer, and so spacing objectives are assigned a larger weight than the objectives for the width objectives.

For example, referring again to FIG. 5, suppose that the weight $w_1$ is assigned to the objectives representing M1 recommended spacing (C1 and C4), and $w_2$ is assigned to the objectives representing M1 recommended width (C2, C5, and C6). The constant $w_0$ is assigned to the objectives representing the minimum base ground-rule values for spacing and width. For example, set $w_0=100*w_1$ to insure that the objectives associated with the minimum-base ground rule values will be satisfied before any of the recommended ground-rule values. Let $x_i$ be the variable representing the position of edge $e_i$, i=1, 2, . . . , 6. Since M1 spacing is more important than M1 width, we set $w_1=100*w_2$. Further, suppose that the minimum base ground-rule values and recommended ground-rule values are given by:

| Base Ground Rule | Minimum Base Ground Rule Value | Recommended Ground Rule Value |
|---|---|---|
| M1 width | 10 | 12 |
| M1 space | 11 | 14 |

Then the resulting objective function would be:

$$F(x_1,x_2,x_3,x_4,x_5,x_6)=F_1(x_1,x_2)+G_1(x_1,x_2)+F_2(x_2,x_3)+G_2(x_2,x_3)+F_1(x_3,x_4)+G_1(x_3,x_4)+F_2(x_4,x_5)+G_2(x_4,x_5)+F_1(x_5,x_6)+G_1(x_5,x_6),$$

where
$F_1(x_i, x_j)=w_1*[12-(x_j-x_i)]$ if $x_j-x_i \leq 12$; 0 otherwise
$G_1(x_i, x_j)=w_0*[10-(x_j-x_i)]$ if $x_j-x_i \leq 10$; 0 otherwise
and
$F_2(x_i, x_j)=w_2*[14-(x_j-x_i)]$ if $x_j-x_i \leq 14$; 0 otherwise
$G_2(x_i, x_j)=w_0*[11-(x_j-x_i)]$ if $x_j-x_i \leq 11$; 0 otherwise.

It is thus believed that the operation and construction of the present invention will be apparent from the foregoing description. While the method and system shown and described has been characterized as being preferred, it will be readily apparent that various changes and/or modifications could be made without departing from the spirit and scope of the present invention as defined in the following claims.

What is claimed is:

1. A method of optimizing a layout of an integrated circuit design, the method comprising the steps of:
scanning a layout;
assigning optimization variables to objects in the layout;
creating an objective function equation that represents minimum design ground rules and manufacturer's recommended design ground rules in the layout;
allocating a set of minimum design ground rules a highest weighting in the objective function equation;
allocating a set of manufacturer's recommended design ground rules a logarithmic weighting in the objective function equation; and
optimizing the layout according to the manufacturer's recommended design ground rules and minimum design ground rules weighted values;
wherein the step of allocating a logarithmic weighting to the manufacturer's recommended design ground rules comprises the step of:
assigning a logarithmic weighting to each of the manufacturer's recommended design ground rules; and
wherein the step of optimizing the layout based on the manufacturer's recommended ground rules and minimum design ground rules weighted values includes the step of:
allocating a logarithmic weighting to a first group of manufacturer's recommended design ground rules and allocating a logarithmic weighting to a second group of manufacturer's recommended design ground rules such that a sum of a specified number of weighted values of the second group that are added together is less than a weighted value of a single member of the first group, and such that a sum of a specified number of weighted values from the first group that are added together is less than a weighted value of a single member of a group corresponding to the minimum design ground rules.

2. The method of claim 1 wherein the step of optimizing includes the step of:
optimizing the minimum design ground rules so that they have a higher weighting than the manufacturer's recommended design ground rules weighting.

3. The method of claim 2 wherein the step of optimizing includes the step of:
optimizing the layout so it falls within a limit value of the minimum design ground rules.

4. The method of claim 3 wherein the step of optimizing the layout according to the manufacturer's recommended design ground rule weighted values includes the step of:
optimizing the layout according to the manufacturer's recommended design ground rule weighted values such that the layout is compliant with a first priority class of the manufacturer's recommended design ground rule weighted values and partially compliant with a second priority class of the manufacturer's recommended design ground rule weighted values.

5. An apparatus for optimizing a layout of an integrated circuit design, the apparatus comprising:
means for scanning a layout;
means for assigning optimization variables to objects in the layout;
means for creating an objective function equation that represents minimum design ground rules and manufacturer's recommended design ground rules in the layout;
means for allocating a set of minimum design ground rules a highest weighting in the objective function equation;
means for allocating a set of manufacturer's recommended design ground rules a logarithmic weighting in the objective function equation; and
means for optimizing the layout according to the manufacturer's recommended design ground rules and minimum design ground rules weighted values;
wherein the means for allocating a logarithmic weighting to the manufacturer's recommended design ground rules comprises: means for assigning a logarithmic weighting to each of the manufacturer's recommended design ground rules; and wherein the means for optimizing the layout based on the manufacturer's recommended ground rules and minimum design ground rules weighted values comprises:

means for allocating a logarithmic weighting to a first group of manufacturer's recommended design ground rules and allocating a logarithmic weighting to a second group of manufacturer's recommended design ground rules such that a sum of a specified number of weighted values of the second group that are added together is less than a weighted value of a single member of the first group, and such that a sum of a specified number of weighted values from the first group that are added together is less than a weighted value of a single member of a group corresponding to the minimum design ground rules.

6. The apparatus of claim 5 wherein the means for optimizing includes:

means for optimizing the minimum design ground rules so that they have a higher weighting than the manufacturer's recommended design ground rules weighting.

7. The apparatus of claim 6 wherein the means for optimizing includes:

means for optimizing the layout so it falls within a limit value of the minimum design ground rules.

8. The apparatus of claim 7 wherein the means for optimizing the layout according to the manufacturer's recommended design ground rule weighted values includes:

means for optimizing the layout according to the manufacturer's recommended design ground rule weighted values such that the layout is compliant with a first priority class of the manufacturer's recommended design ground rule weighted values and partially compliant with a second priority class of the manufacturer's recommended design ground rule weighted values.

9. A machine readable medium comprising computer usable program code, which when executed by a computer, performs a method for optimizing a layout of an integrated circuit design, the computer usable program code comprising:

computer usable program code for scanning a layout;

computer usable program code for assigning optimization variables to objects in the layout;

computer usable program code for creating an objective function equation that represents minimum design ground rules and manufacturer's recommended design ground rules in the layout;

computer usable program code for allocating a set of minimum design ground rules a highest weighting in the objective function equation;

computer usable program code for allocating a set of manufacturer's recommended design ground rules a logarithmic weighting in the objective function equation; and computer usable program code for optimizing the layout according to the manufacturer's recommended design ground rules and minimum design ground rules weighted values;

wherein the computer usable program code for allocating a logarithmic weighting to the manufacturer's recommended design ground rules comprises:

computer usable program code for assigning a logarithmic weighting to each of the manufacturer's recommended design ground rules; and wherein the computer usable program code for optimizing the layout based on the manufacturer's recommended ground rules and minimum design ground rules weighted values comprises:

computer usable program code for allocating a logarithmic weighting to a first group of manufacturer's recommended design ground rules and allocating a logarithmic weighting to a second group of manufacturer's recommended design ground rules such that a sum of a specified number of weighted values of the second group that are added together is less than a weighted value of a single member of the first group, and such that a sum of a specified number of weighted values from the first group that are added together is less than a weighted value from the first group are added together the sum is less than a weighted value of a single member of a group corresponding to the minimum design ground rules.

10. The computer program product of claim 9 wherein the computer usable program code for optimizing includes:

computer usable program code for optimizing the minimum design ground rules so that they have a higher weighting than the manufacturer's recommended design ground rules weighting.

11. The computer program product of claim 10 wherein the computer usable program code for optimizing includes:

computer usable program code for optimizing the layout so it falls within a limit value of the minimum design ground rules.

12. The computer program product of claim 11 wherein the computer usable program code for optimizing the layout according to the manufacturer's recommended design ground rule weighted values includes:

computer usable program code for optimizing the layout according to the manufacturer's recommended design ground rule weighted values such that the layout is compliant with a first priority class of the manufacturer's recommended design ground rule weighted values and partially compliant with a second priority class of the manufacturer's recommended design ground rule weighted values.

* * * * *